US010446565B2

(12) United States Patent
Oh et al.

(10) Patent No.: US 10,446,565 B2
(45) Date of Patent: Oct. 15, 2019

(54) SEMICONDUCTOR MEMORY DEVICE OF THREE-DIMENSIONAL STRUCTURE INCLUDING A DUMMY BLOCK

(71) Applicant: SK hynix Inc., Gyeonggi-do (KR)

(72) Inventors: Sung-Lae Oh, Chungcheongbuk-do (KR); Dong-Hyuk Kim, Seoul (KR); Soo-Nam Jung, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 4 days.

(21) Appl. No.: 15/856,933

(22) Filed: Dec. 28, 2017

(65) Prior Publication Data

US 2019/0043872 A1    Feb. 7, 2019

(30) Foreign Application Priority Data

Aug. 7, 2017 (KR) .................. 10-2017-0099370

(51) Int. Cl.
*H01L 27/11529* (2017.01)
*H01L 27/11519* (2017.01)
(Continued)

(52) U.S. Cl.
CPC .... *H01L 27/11529* (2013.01); *G11C 16/0483* (2013.01); *H01L 27/1157* (2013.01); *H01L 27/11519* (2013.01); *H01L 27/11524* (2013.01); *H01L 27/11548* (2013.01); *H01L 27/11565* (2013.01); *H01L 27/11573* (2013.01);
(Continued)

(58) Field of Classification Search
CPC ........... H01L 27/11529; H01L 27/1157; H01L 27/11582; H01L 27/11556; H01L 27/11524; H01L 27/11575; H01L 21/8221
See application file for complete search history.

(56) References Cited

U.S. PATENT DOCUMENTS 8,848,456 B2 * 9/2014 Han ................. G11C 16/04
365/185.18
8,933,502 B2 * 1/2015 Higashitani ....... H01L 27/11519
257/326
(Continued)

FOREIGN PATENT DOCUMENTS

KR    1020160108052    9/2016
KR    1020170125551    11/2017

*Primary Examiner* — Khiem D Nguyen
(74) *Attorney, Agent, or Firm* — IP & T Group LLP

(57) ABSTRACT

A semiconductor memory device includes first and second memory blocks each including conductive and dielectric layers alternately stacked over a semiconductor layer disposed over a substrate, and disposed adjacent to each other in a first direction; a dummy block disposed over the semiconductor layer, and provided between the first and second memory blocks; first pass transistors formed over the substrate below the first memory block, and coupled to conductive layers, respectively, of the first memory block; second pass transistors formed over the substrate below the second memory block, and coupled to conductive layers, respectively, of the second memory block; bottom global row lines between the first and second pass transistors and the semiconductor layer, and each coupled to one of the first pass transistors and one of the second pass transistors; and top global row lines formed over the dummy block, and coupled to the bottom global row lines.

19 Claims, 13 Drawing Sheets

(51) Int. Cl.
*H01L 27/11565* (2017.01)
*H01L 27/11524* (2017.01)
*H01L 27/11573* (2017.01)
*G11C 16/04* (2006.01)
*H01L 27/1157* (2017.01)
*H01L 27/11548* (2017.01)
*H01L 27/11575* (2017.01)
G11C 16/08 (2006.01)
H01L 27/11556 (2017.01)
H01L 27/11582 (2017.01)

(52) U.S. Cl.
CPC ........ *H01L 27/11575* (2013.01); *G11C 16/08* (2013.01); *H01L 27/11556* (2013.01); *H01L 27/11582* (2013.01)

(56) References Cited

U.S. PATENT DOCUMENTS

| | | | |
|---|---|---|---|
| 9,000,510 B2* | 4/2015 | Hong | H01L 27/11582 257/324 |
| 9,806,092 B1* | 10/2017 | Minemura | H01L 27/11565 |
| 2016/0268290 A1* | 9/2016 | Matsunaga | H01L 27/11582 |
| 2017/0069731 A1* | 3/2017 | Kim | H01L 27/11556 |
| 2017/0263618 A1* | 9/2017 | Shimojo | H01L 27/11519 |
| 2017/0323898 A1* | 11/2017 | Oh | H01L 27/11582 |

* cited by examiner

SEMICONDUCTOR MEMORY DEVICE OF THREE-DIMENSIONAL STRUCTURE INCLUDING A DUMMY BLOCK

CROSS-REFERENCE TO RELATED APPLICATION

The present application claims priority to Korean Patent Application No. 10-2017-0099370 filed in the Korean Intellectual Property Office on Aug. 7, 2017, which is incorporated herein by reference in its entirety.

BACKGROUND

1. Technical Field

Various embodiments generally relate to a semiconductor memory device, and, more particularly, to a semiconductor memory device of a three-dimensional structure.

2. Related Art

As the degree of integration of a semiconductor memory device of a two-dimensional structure in which memory cells are formed in a single layer on a substrate has reached its limit, a semiconductor memory device of a three-dimensional structure in which a plurality of memory cells are formed along a channel layer projecting in a vertical direction from a substrate has been suggested. Recently, various efforts for realizing a three-dimensional semiconductor memory device in a smaller size have been being attempted.

SUMMARY

In an embodiment a semiconductor memory device may include: first and second memory blocks disposed adjacent to each other in a first direction, each of the first and second memory blocks including a plurality of conductive layers and a plurality of dielectric layers alternately stacked over a semiconductor layer disposed over a substrate, and a plurality of channel structures passing through the conductive layers and the dielectric layers; a dummy block disposed over the semiconductor layer, and provided between the first memory block and the second memory block; a plurality of first pass transistors formed over the substrate below the first memory block, and coupled to conductive layers, respectively, of the first memory block; a plurality of second pass transistors formed over the substrate below the second memory block, and coupled to conductive layers, respectively, of the second memory block; a plurality of bottom global row lines formed in a bottom wiring layer below the semiconductor layer, and each coupled in common to one of the first pass transistors and one of the second pass transistors; and top global row lines formed over the dummy block, and coupled to the bottom global row lines, respectively, through first contact plugs which pass through the dummy block.

In an embodiment, a semiconductor memory device may include: a substrate defined with a plurality of cell regions arranged along a second direction different from a first direction and contact regions disposed between the cell regions; first and second memory blocks disposed adjacent to each other in the first direction, each including a plurality of conductive layers and a plurality of dielectric layers alternately stacked over a semiconductor layer formed over the substrate, and a plurality of channel structures passing through the conductive layers and the dielectric layers in the cell regions; a dummy block disposed over the semiconductor layer between the first memory block and the second memory block; first pass transistor units each including a predetermined number of first pass transistors coupled to conductive layers of the first memory block, and formed over even-numbered cell regions of the substrate to overlap with the first memory block; second pass transistor units each including a predetermined number of second pass transistors coupled to conductive layers of the second memory block, and formed over odd-numbered cell regions of the substrate to overlap with the second memory block; bottom global row lines formed in a bottom wiring layer below the semiconductor layer, and each coupled in common to one of the first pass transistors and one of the second pass transistors; and a plurality of top global row lines formed over the dummy block, and coupled to the bottom global row lines, respectively, through first contact plugs which pass through the dummy block and the semiconductor layer.

DETAILED DESCRIPTION

Hereinafter, a semiconductor memory device of a three-dimensional structure will be described with reference to the accompanying drawings through various embodiments.

Figure 1:
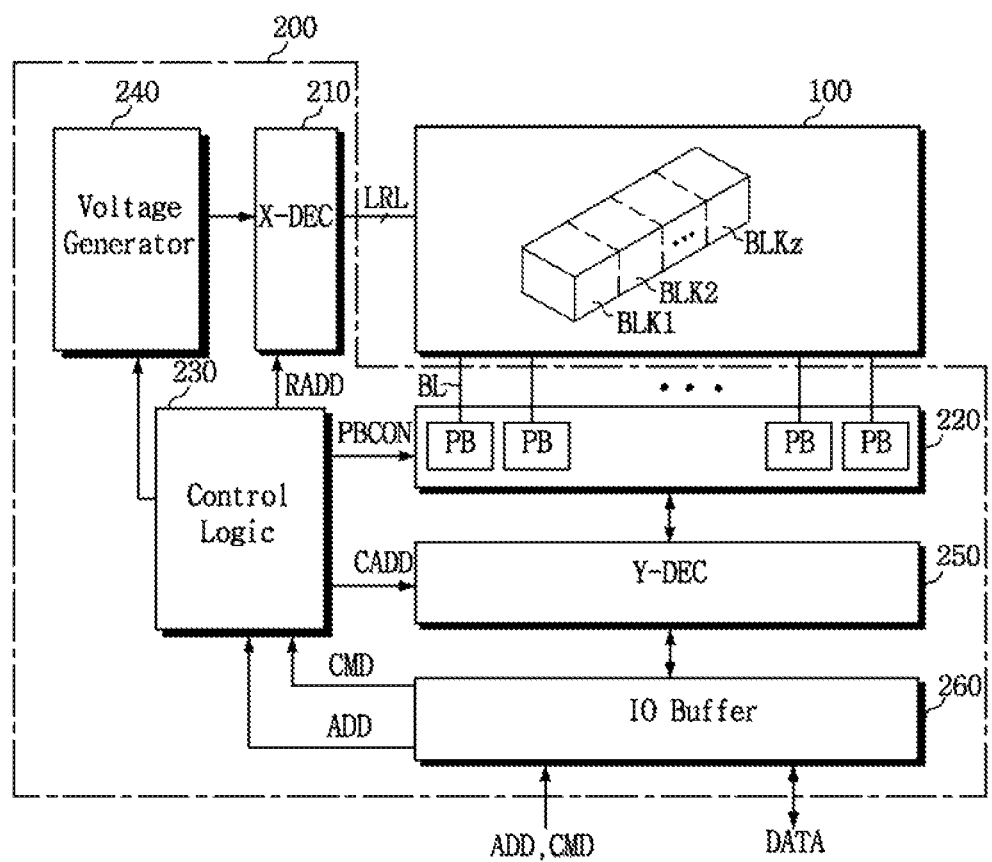
FIG. 1 is a block diagram illustrating a semiconductor memory device according to an embodiment of the present invention.

FIG. 1 is a block diagram illustrating a semiconductor memory device according to an embodiment of the present invention.

Referring to FIG. 1, the semiconductor memory device may include a memory cell array 100 and a peripheral circuit 200. The peripheral circuit 200 may include a row decoder 210, a page buffer circuit 220, a control logic 230, a voltage generator 240, a column decoder 250, and an input/output buffer 260.

The memory cell array 100 may include a plurality of memory blocks BLK1 to BLKz. Each of the memory blocks BLK1 to BLKz may include a plurality of cell strings. Each of the cell strings may include a plurality of memory cells, which are stacked on a substrate. The memory cells may be nonvolatile memory cells.

The memory cell array 100 may be coupled to the row decoder 210 through local row lines LRL. The local row lines LRL may include one or more local drain select lines, a plurality of local word lines and one or more local source select lines. The memory cell array 100 may be coupled to the page buffer circuit 220 through bit lines BL. The local row lines LRL may be coupled to the respective memory blocks BLK1 to BLKz. The bit lines BL may be coupled in common to the plurality of memory blocks BLK1 to BLKz.

The row decoder 210 may select any one of the memory blocks BLK to BLKz of the memory cell array 100 in response to a row address RADD from the control logic 230. The row decoder 210 may transfer operating voltages produced from the voltage generator 240, to local row lines LRL coupled to a selected memory block.

The page buffer circuit 220 may include a plurality of page buffers PB, which are coupled to the memory cell array 100 through the bit lines BL. The page buffers PB may operate as write drivers or sense amplifiers depending on an operation mode. In a program operation, the plurality of page buffers PB may latch data DATA received through the input/output buffer 260 and the column decoder 250, and apply voltages necessary for storing the data DATA in selected memory cells to the bit lines BL, in response to a page buffer control signal PBCON from the control logic 230. In a read operation, the plurality of page buffers PB may read out data DATA stored in selected memory cells through the bit lines BL, and output the read-out data DATA through the column decoder 250 and the input/output buffer 260. In an erase operation, the plurality of page buffers PB may float the bit lines BL.

The control logic 230 may output a row address RADD of an address ADD received through the input/output buffer 260 to the row decoder 210, and output a column address CADD of the address ADD to the column decoder 250. The control logic 230 may control the page buffer circuit 220 and the voltage generator 240 to access selected memory cells, in response to a command CMD received through the input/output buffer 260. The control logic 230 may output the page buffer control signal PBCON to control the page buffer circuit 220.

The voltage generator 240 may generate various voltages required in the semiconductor memory device. For example, the voltage generator 240 may generate program voltages, pass voltages, selected read voltages and unselected read voltages.

The column decoder 250 may input program data to the page buffer circuit 220 in response to the column address CADD from the control logic 230.

Hereinbelow, in the accompanying drawings, a direction vertically projecting from the top surface of a substrate is defined as a vertical direction VD, and two directions parallel to the top surface of the substrate and intersecting with each other are defined as a first direction FD and a second direction SD, respectively. The first direction FD and the second direction SD may intersect substantially perpendicular to each other. In the drawings, a direction indicated by an arrow and a direction opposite thereto represent the same direction.

Figure 2:
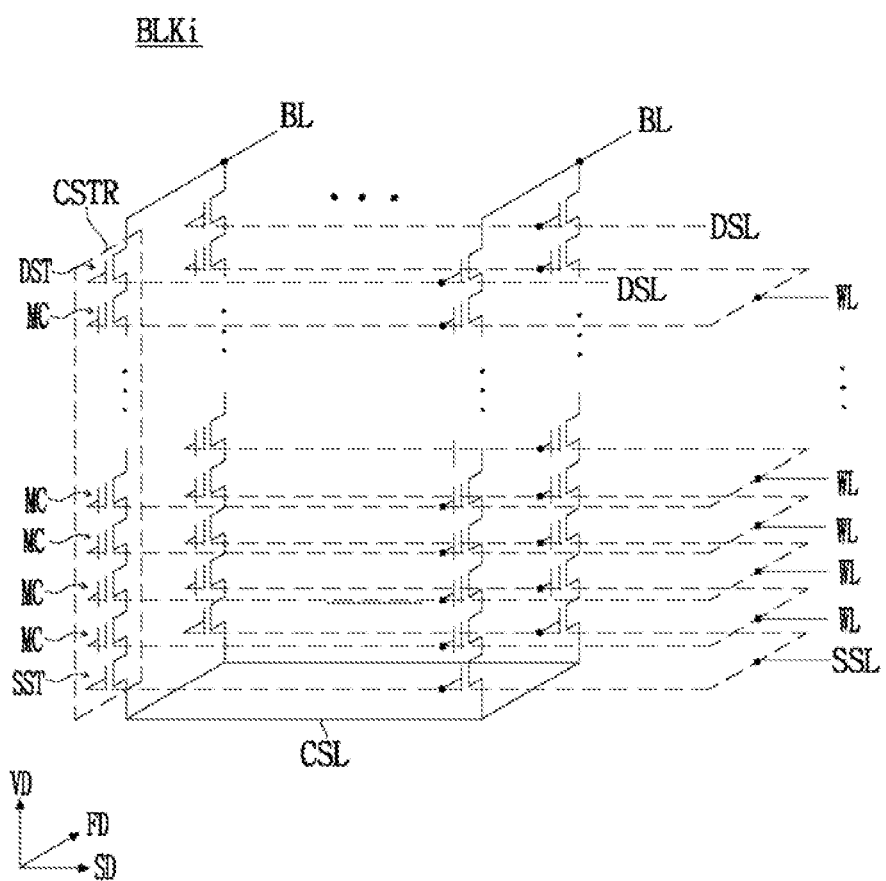
FIG. 2 is an equivalent circuit diagram illustrating a memory block shown in FIG. 1.

FIG. 2 is a circuit diagram illustrating a memory block BLKi among any one of the plurality of memory blocks included in the memory cell array of FIG. 1.

Referring to FIG. 2, the memory block BLKi may include a plurality of cell strings CSTR, which are coupled between a plurality of bit lines BL and a common source line CSL.

The cell strings CSTR may be formed in the vertical direction VD. The bit lines BL may extend in the first direction FD and be arranged along the second direction SD.

A plurality of cell strings CSTR may be coupled in parallel to each of the bit lines BL. The cell strings CSTR may be coupled in common to the common source line CSL. That is, the plurality of cell strings CSTR may be coupled between the plurality of bit lines BL and one common source line CSL.

Each of the cell strings CSTR may include a source select transistor SST, which is coupled to the common source line CSL, a drain select transistor DST, which is coupled to a corresponding bit line BL, and a plurality of memory cells MC, which are coupled between the source select transistor SST and the drain select transistor DST. The source select transistor SST, the memory cells MC, and the drain select transistor DST may be coupled in series along the vertical direction VD.

A source select line SSL, a plurality of word lines WL, and drain select lines DSL may be stacked in the vertical direction VD between the common source line CSL and the bit lines BL. The source select line SSL may be coupled to the gates of source select transistors SST. The respective word lines WL may be coupled to the gates of corresponding memory cells MC. The respective drain select lines DSL may be coupled to the gates of corresponding drain select transistors DST.

The source select line SSL, the plurality of word lines WL, and the drain select lines DSL may be coupled to the respective local row lines LRL (see FIG. 1), and may be coupled to the row decoder 210 (see FIG. 1) through the local row lines LRL.

Figure 3:
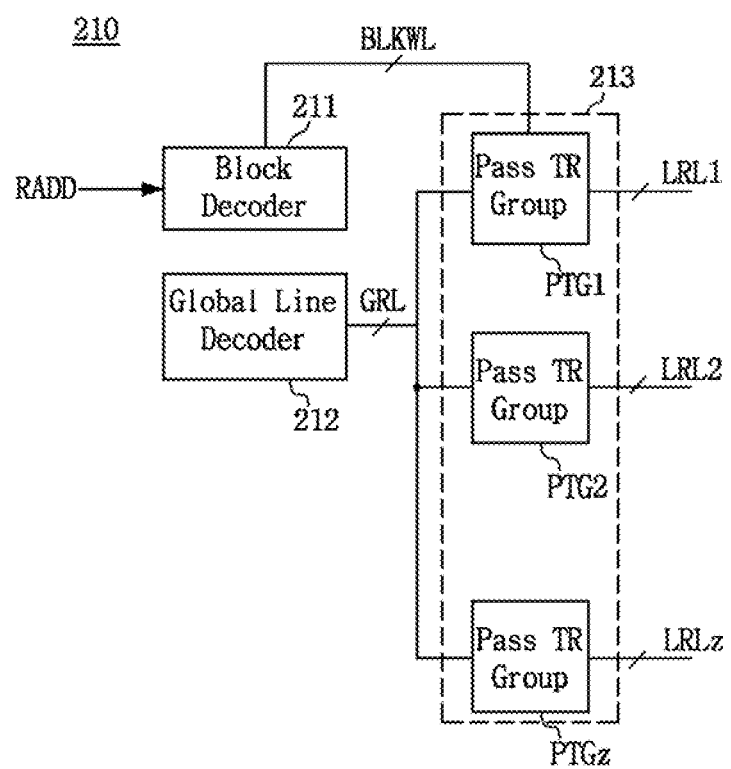
FIG. 3 is a block diagram illustrating a row decoder shown in FIG. 1.

FIG. 3 is a block diagram illustrating the row decoder 210 shown in FIG. 1.

Referring to FIG. 3, the row decoder 210 may include a block decoder 211, a global line decoder 212 and a pass transistor circuit 213.

The block decoder 211 may receive the row address RADD from the control logic 230 (see FIG. 1). The block decoder 211 may be coupled to a plurality of pass transistor groups PTG1 to PTGz of the pass transistor circuit 213, through a plurality of block word lines BLKWL. The block decoder 211 may select any one of the pass transistor groups PTG1 to PTGz of the pass transistor circuit 213 in response to the row address RADD received therein.

The global line decoder 212 may be coupled to the plurality of pass transistor groups PTG1 to PTGz through global row lines GRL. The global line decoder 212 may transfer voltages produced from the voltage generator 240 (see FIG. 1) to the global row lines GRL in response to a control from the control logic 230.

The pass transistor circuit 213 may include the plurality of pass transistor groups PTG1 to PTGz corresponding to the respective memory blocks BLK1 to BLKz (see FIG. 1). Each of the pass transistor groups PTG1 to PTGz may be coupled between any one of a plurality of local row lines LRL1 to LRLz, which are coupled to the corresponding memory blocks BLK1 to BLKz (see FIG. 1), and the global row lines GRL. For example, a first pass transistor group PTG1 may be coupled between first local row lines LRL1, which are coupled to a first memory block BLK1 and the global row lines GRL; a second pass transistor group PTG2 may be coupled between second local row lines LRL2, which are coupled to a second memory block BLK2 and the global row lines GRL.

A pass transistor group selected by the block decoder 211 among the plurality of pass transistor groups PTG1 to PTGz may electrically couple the global row lines GRL and corresponding local row lines (any one of LRL1 to LRLz).

Figure 4:
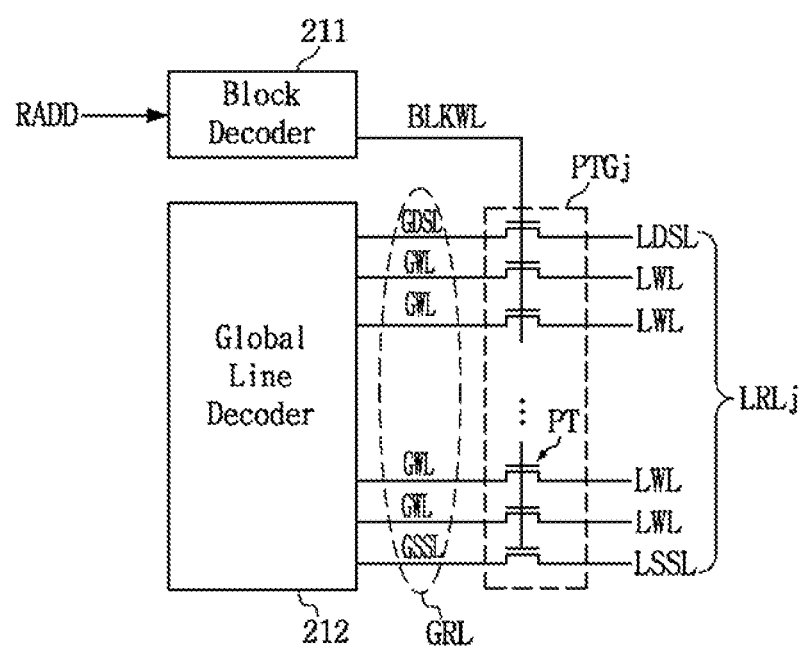
FIG. 4 is a diagram illustrating a coupling relationship of a block decoder, a global line decoder, and any one of pass transistor groups shown in FIG. 3.

FIG. 4 is a diagram illustrating a coupling relationship of the block decoder 211, the global line decoder 212, and any one of a pass transistor group PTGj from the plurality of pass transistor groups PTG1 to PTGz (see FIG. 3).

Referring to FIG. 4, the pass transistor group PTGj may be coupled between the global row lines GRL and local row lines LRLj.

The global row lines GRL may include at least one global drain select line GDSL, a plurality of global word lines GWL, and at least one global source select line GSSL. The local row lines LRLj may include at least one local drain select line LDSL, a plurality of local word lines LWL, and at least one local source select line LSSL.

The pass transistor group PTGj may include a plurality of pass transistors PT, which are coupled between the global row lines GRL and the local row lines LRLj.

The block decoder 211 may be coupled in common to gates of the pass transistors PT, which are included in the pass transistor group PTGj, through a block word line BLKWL. The block decoder 211 may receive a voltage from the voltage generator 240 (see FIG. 1), and may transfer that voltage to the block word line BLKWL in response to a control from the control logic 230 (see FIG. 1).

The global line decoder 212 may be coupled to the global row lines GRL. The global line decoder 212 may receive a voltage from the voltage generator 240, and may transfer that voltage to the global row lines GRL in response to a control from the control logic 230.

The pass transistors PT of the pass transistor group PTGj may electrically couple the global row lines GRL and the local row lines LRLj in response to a signal from the block word line BLKWL, and may transfer the voltage applied to the global row lines GRL to the local row lines LRLj.

Figure 5:
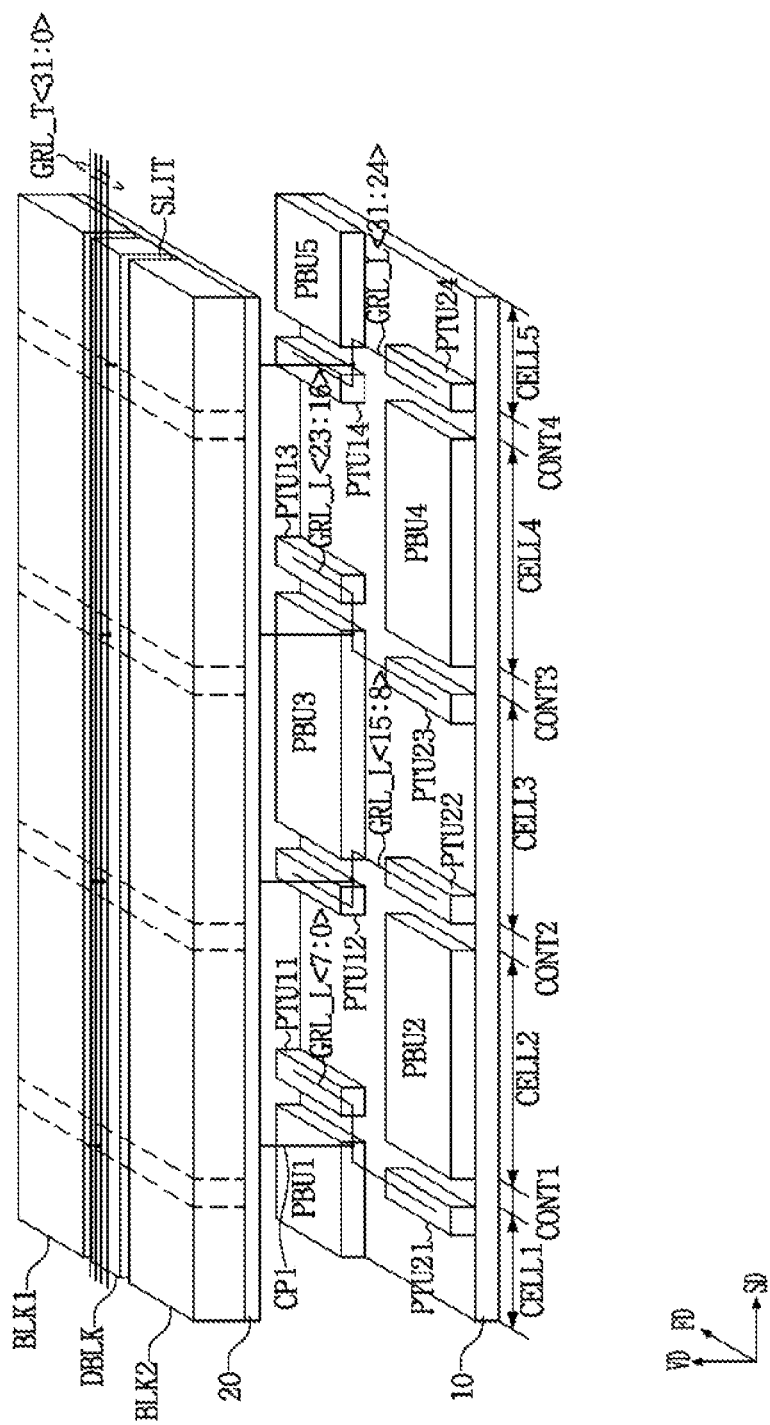
FIG. 5 is a perspective view schematically illustrating a semiconductor memory device according to an embodiment of the present invention.
Figure 6:
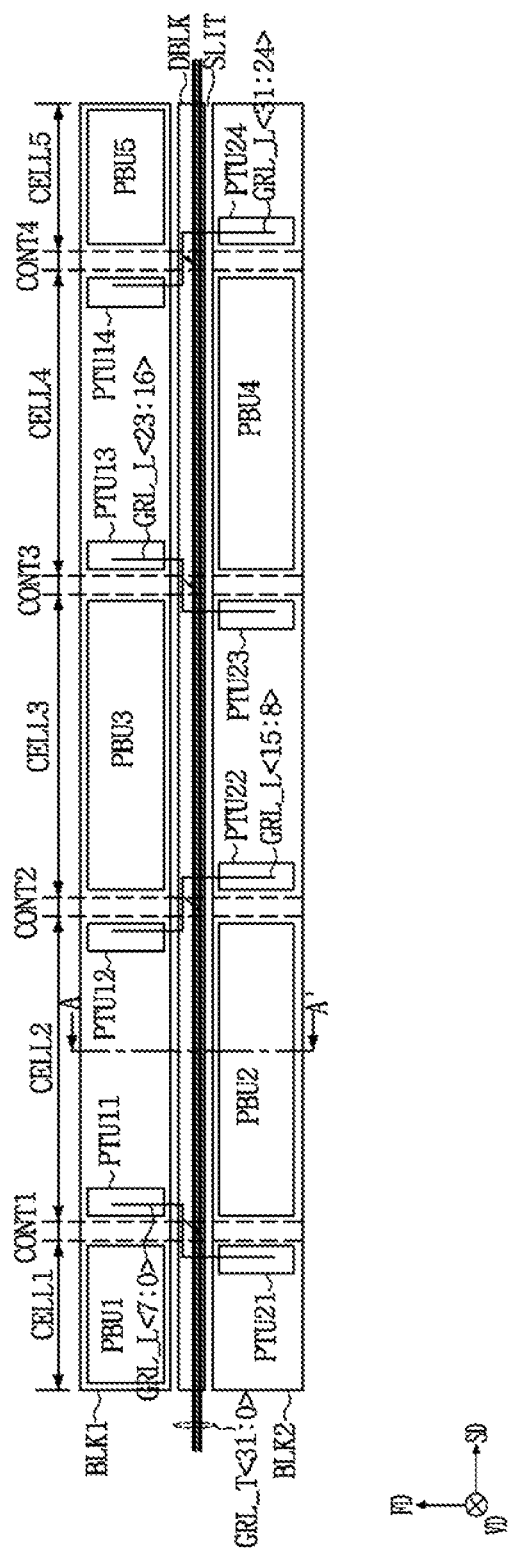
FIG. 6 is a top view schematically illustrating a semiconductor memory device.
Figure 7:
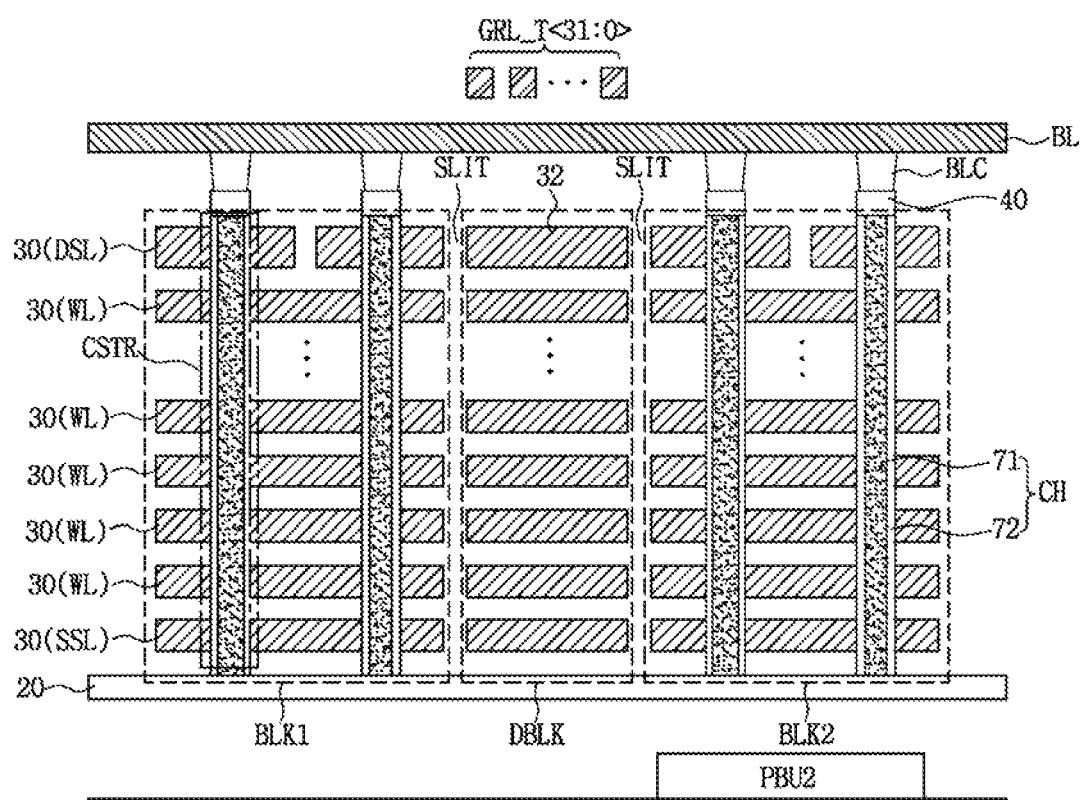
FIG. 7 is a cross-sectional view schematically illustrating a semiconductor memory device taken along the line A-A' of FIG. 6.

FIG. 5 is a perspective view schematically illustrating a semiconductor memory device according to the embodiment of the present invention. FIG. 6 is a top view schematically illustrating the semiconductor memory device. FIG. 7 is a cross-sectional view taken along a line A-A' of FIG. 6.

The semiconductor memory device according to the embodiment of the present invention may have a peri under cell (PUC) structure. Referring to FIGS. 5 and 6, a peripheral circuit element, which includes a plurality of page buffer units PBU1 to PBU5 and a plurality of pass transistor units PTU11 to PTU24, may be disposed under the first memory block BLK1 and the second memory block BLK2.

The plurality of page buffer units PBU1 to PBU5 and the plurality of pass transistor units PTU11 to PTU24 may be disposed on a substrate 10, and the first memory block BLK1 and the second memory block BLK2 may be disposed on a semiconductor layer 20. According to the present embodiment, since the plurality of page buffer units PBU1 to PBU5 and the plurality of pass transistor units PTU11 to PTU24 overlap with the first memory block BLK1 and the second memory blocks BLK2 in a vertical direction VD an area may be efficiently utilized and thus the size of the semiconductor memory device may be reduced.

The substrate 10 may be a monocrystalline silicon substrate. The substrate 10 may include a polysilicon substrate, a silicon-on-insulator (SOI) substrate, or a germanium-on-insulator (GeOI) substrate. The substrate 10 may include Si, Ge, or SiGe. The substrate 10 may have a main surface that extends along the first direction FD and the second direction SD.

A plurality of cell regions CELL1 to CELL5 and a plurality of contact regions CONT1 to CONT4 may be formed in the substrate 10. The cell regions CELL1 to CELL5 may be formed along the second direction SD. The contact regions CONT1 to CONT4 may be formed between the cell regions CELL1 to CELL5. That is, the plurality of cell regions CELL1 to CELL5 and the plurality of contact regions CONT1 to CONT4 may be alternately formed along the second direction SD in the substrate 10.

An interlayer dielectric layer (not shown), which covers the page buffer units PBU1 to PBU5 and the pass transistor units PTU11 to PTU24, may be disposed on the substrate 10 and the semiconductor layer 20 may be disposed on the interlayer dielectric layer.

The semiconductor layer 20 may include a polysilicon. A well region (not shown) may be formed in the semiconductor layer 20. The well region may be a P-type well, which is doped with a P-type impurity. The well region may also be an N-type well. The well region may be formed as a P-type well and an N-type well overlapping with each other.

The first memory block BLK1 and the second memory block BLK2 may be disposed on the semiconductor layer 20. The first memory block BLK1 and the second memory block BLK2 may be disposed adjacent to each other in the first direction FD. The first memory block BLK1 and the second memory block BLK2 may extend in the second direction SD, and may traverse the cell regions CELL1 to CELL5 and the contact regions CONT1 to CONT4.

A dummy block DBLK may be disposed on the semiconductor layer 20 between the first memory block BLK1 and the second memory block BLK2. Slits SLIT, which are formed in the second direction SD, may separate the first memory block BLK1 and the dummy block DBLK from each other, and may separate the second memory block BLK2 and the dummy block DBLK from each other.

Referring to FIG. 7, each of the first memory block BLK1 and the second memory blocks BLK2 may include a plurality of conductive layers 30 and a plurality of dielectric layers (not shown), both of which are alternately stacked. At least one conductive layer 30 from the lowermost position of the conductive layers 30 may be used as the source select line SSL and at least one conductive layer 30 from the uppermost position of the conductive layers 30 may be used the drain select lines DSL. The conductive layers 30 disposed between the source select line SSL and the drain select lines DSL may be used as the plurality of word lines WL.

A plurality of channel structures CH, which pass through the conductive layers 30 and the dielectric layers in the vertical direction VD, may be formed on the semiconductor layer 20. The channel structures CH may include a channel layer 71 and a gate dielectric layer 72, which is disposed between the channel layer 71 and the conductive layers 30. The channel layer 71 may include a polysilicon or monocrystalline silicon, and may include a P-type impurity such as boron (B) in some regions. The channel layer 71 may have a pillar shape or a solid cylinder shape that is filled up to its center. While not shown, the channel layer 71 may have a tube shape in which a center region is open. A buried dielectric layer may be formed in the open center region of the channel layer 71.

The gate dielectric layer 72 may have a straw shape or a cylinder shell shape that surrounds the outer wall of the channel layer 71. While not shown, the gate dielectric layer 72 may include a tunnel dielectric layer, a charge storage layer, and a blocking layer, all of which are stacked from the outer wall of the channel layer 71. The tunnel dielectric layer may include a silicon oxide, a hafnium oxide, an aluminum oxide, a zirconium oxide, or a tantalum oxide. The charge storage layer may include a silicon nitride, a boron nitride, a silicon boron nitride, or a polysilicon doped with an impurity. The blocking layer may include a single layer or a stacked layer of a silicon oxide, a silicon nitride, hafnium oxide, an aluminum oxide, a zirconium oxide and a tantalum oxide. In some embodiments, the gate dielectric layer 72 may have an oxide-nitride-oxide (ONO) stacked structure in which an oxide layer, a nitride layer, and an oxide layer are stacked.

Source select transistors are formed where the source select line SSL surrounds the channel structures CH, memory cells are formed where the word lines WL surround the channel structures CH, and drain select transistors are formed where the drain select lines DSL surround the channel structures CH. By the above-described structure, a plurality of cell strings CSTR including the source select transistors, the memory cells, and the drain select transistors, all of which are disposed along the respective channel structures CH may be configured.

Drains 40 may be disposed on the respective channel structures CH. The drains 40 may include a silicon material which is doped with an impurity. For example, the drains 40 may include N-type silicon.

Bit line contacts BLC may be disposed on the respective drains 40. Bit lines BL may be coupled to the drains 40 through the bit line contacts BLC. The bit lines BL may extend in the first direction FD. The channel structures CH, which are disposed in a line along the first direction FD, may be coupled in common to a single bit line BL.

The dummy block DBLK may have a three-dimensional structure in which a plurality of dummy conductive layers 32 and a plurality of dielectric layer (not shown) are alternately stacked. The number of the dummy conductive layers 32 included in the dummy block DBLK may be substantially the same as the number of the conductive layers 30 included in each of the first memory block BLK1 and second memory block BLK2.

The dummy conductive layers 32 may be disposed at the same layers as the respective conductive layers 30. The conductive layers 30 and the dummy conductive layers 32, which are positioned at the same layers as the respective conductive layers 30, may be formed at the same processing step. Because the dummy conductive layers 32 and the conductive layers 30 may be formed at the same processing step, thicknesses and materials of the conductive layers 30 and the dummy conductive layers 32 may be substantially the same.

Top global row lines GRL_T<31:0> may be disposed over the bit lines BL. The top global row lines GRL_T<31:0> may extend in the second direction SD, and may be arranged along the first direction FD. While not shown, a dielectric layer may be disposed between the bit lines BL and the top global row lines GRL_T<31:0>.

Figure 8:
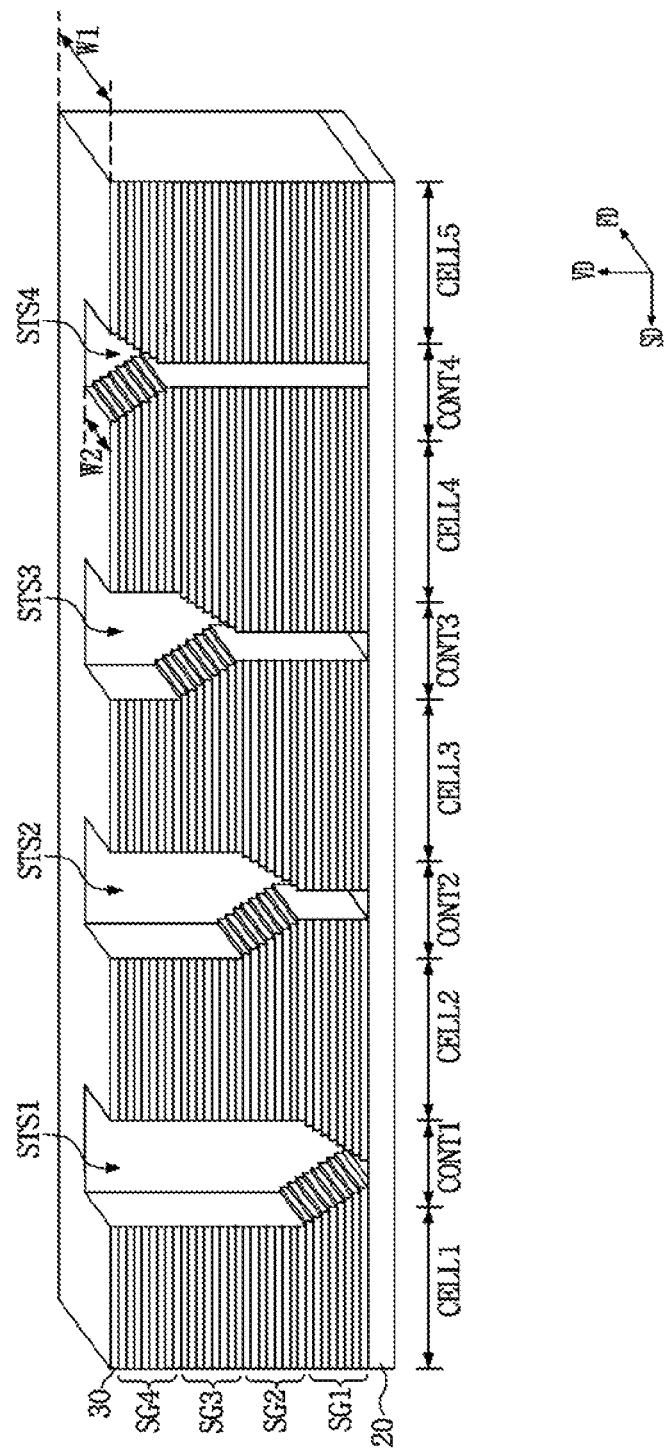
FIG. 8 is a perspective view schematically illustrating a memory block according to an embodiment of the present invention.

FIG. 8 is a perspective view concretely illustrating a memory block according to the embodiment of the present invention.

The memory block shown in FIG. 8 represents one of the first memory block BLK1 and the second memory block BLK2 shown in FIGS. 5 and 6.

Referring to FIG. 8, the memory block may include N (N is a natural number equal to or greater than 2) number of stack groups SG1 to SG4, which are stacked on the semiconductor layer 20 in the vertical direction VD.

The stack groups SG1 to SG4 may correspond to the respective contact regions CONT1 to CONT4, and the number of the stack groups SG1 to SG4 may be the same as the number of the contact regions CONT1 to CONT4. FIG. 8 illustrates a case where four stack groups SG1 to SG4 are included. Hereafter, for convenience, the four stack groups SG1 to SG4 will be defined as first to fourth stack groups SG1 to SG4.

Among the first to fourth stack groups SG1 to SG4, the first stack group SG1 is disposed most adjacent to the semiconductor layer 20. Stack groups SG# may be farther from the semiconductor layer 20 as the numbers # thereof increase. The fourth stack group SG4 may be disposed farthest from the semiconductor layer 20.

Each of the first to fourth stack groups SG1 to SG4 may include the plurality of conductive layers 30, which are included in the memory block and are stacked in the vertical direction VD. FIG. 8 illustrates as an example a case where each of the first to fourth stack groups SG1 to SG4 includes eight conductive layers 30. While illustration of dielectric layers is omitted in FIG. 8 for the sake of illustrative simplicity, it is to be understood that dielectric layers are formed between the conductive layers 30.

In the respective first to fourth contact regions CONT1 to CONT4, stepped grooves, which expose the conductive layers 30 of the corresponding stack groups in step-like shapes, may be formed. For example, in the first contact region CONT1, a first stepped groove STS1, which exposes the conductive layers 30 of the first stack group SG1 in a step-like shape, may be formed. In the remaining second to fourth contact regions CONT2 to CONT4, second to fourth stepped grooves STS2 to STS4 may be formed respectively in a manner similar to the first contact region CONT1.

Each of the first to fourth stepped grooves STS1 to STS4 may be formed by patterning the conductive layers 30 of the corresponding stack group in a step-like shape. The step portions of the conductive layers 30, which are exposed by the first to fourth stepped grooves STS1 to STS4, may be used as pads for connection with contact plugs coupled to local row lines.

As the first to fourth stepped grooves STS1 to STS4 are formed in the first to fourth contact regions CONT1 to CONT4, which are arranged in a line along the second direction SD, the first to fourth stepped grooves STS1 to STS4 may also be arranged in a line along the second direction SD.

The width of the first to fourth stepped grooves STS1 to STS4 in the first direction FD is smaller than the maximum width of the conductive layers 30 included in the memory block in the first direction D. For example, if the maximum width of the conductive layers 30 in the first direction FD is W1 and the width of the first to fourth stepped grooves STS1 to STS4 in the first direction FD is W2, then W2 is smaller than W1. Thus, the conductive layers 30 of the memory block have a continuous structure in which they are not cut off by the first to fourth stepped grooves STS1 to STS4.

While not shown in FIG. 8, in the cell regions CELL1 to CELL5, the channel structures CH (see FIG. 7), which pass through the conductive layers 30 in the vertical direction VD, may be disposed along the first direction FD and the second direction SD. A plurality of cell strings CSTR (see FIG. 7) may be formed in the cell regions CELL1 to CELL5.

Referring again to FIGS. 5 and 6, the page buffer units PBU1 to PBU5 may be configured by dividing the page buffers PB (see FIG. 1) included in the page buffer circuit 220 (see FIG. 1) by a predetermined unit (for example, 2 KB). The page buffer units PBU1 to PBU5 may be disposed on the substrate 10 under the first memory block BLK1 and the second memory block BLK2, overlapping with the first memory block BLK1 and second memory block BLK2 in the vertical direction VD.

Among the page buffer units PBU1 to PBU5, the page buffer units PBU1, PBU3, and PBU5 that overlap with the first memory block BLK1 and the page buffer units PBU2 and PBU4 that overlap with the second memory block BLK2 are not disposed in a line along the first direction FD or the second direction SD, but are disposed in directions that intersect with the first direction FD and the second direction SD. Namely, the page buffer units PBU1 to PBU5 are arranged in a zigzag pattern.

For example, the page buffer units PBU1, PBU3, and PBU5 that overlap with the first memory block BLK1 may be disposed in odd-numbered cell regions CELL1, CELL3, and CELL5, and the page buffer units PBU2 and PBU4 that overlap with the second memory block BLK2 may be disposed in even-numbered cell regions CELL2 and CELL4.

The pass transistor units PTU11 to PTU24 may include first pass transistor units PTU11 to PTU14, which are disposed under the first memory block BLK1, and second pass transistor units PTU21 to PTU24, which are disposed under the second memory block BLK2.

The first pass transistor units PTU11 to PTU14 may be configured through dividing the pass transistors included in the first pass transistor group PTG1 (see FIG. 3) by the unit of a predetermined number. For example, when the number of the pass transistors included in the first pass transistor group PTG1 is 32, each of the first pass transistor units PTU11 to PTU14 may include eight pass transistors.

The pass transistors included in the first pass transistor unit PTU11 may be coupled to the respective conductive layers 30 included in the first stack group SG1 (see FIG. 8) of the first memory block BLK1. The pass transistors included in the first pass transistor unit PTU12 may be coupled to the respective conductive layers 30 included in the second stack group SG2 (see FIG. 8) of the first memory block BLK1. The pass transistors included in the first pass transistor unit PTU13 may be coupled to the respective conductive layers 30 included in the third stack group SG3 (see FIG. 8) of the first memory block BLK1. The pass transistors included in the first pass transistor unit PTU14 may be coupled to the respective conductive layers 30 included in the fourth stack group SG4 (see FIG. 8) of the first memory block BLK1.

The second pass transistor units PTU21 to PTU24 may be configured through dividing the pass transistors included in the second pass transistor group PTG2 (see FIG. 3) by the unit of the predetermined number. For example, when the number of the pass transistors included in the second pass transistor group PTG2 is 32, each of the second pass transistor units PTU21 to PTU24 should include eight pass transistors.

The pass transistors included in the second pass transistor unit PTU21 may be coupled to the respective conductive layers 30 included in the first stack group SG1 (see FIG. 8) of the second memory block BLK2. The pass transistors included in the second pass transistor unit PTU22 may be coupled to the respective conductive layers 30 included in the second stack group SG2 (see FIG. 8) of the second memory block BLK2. The pass transistors included in the second pass transistor unit PTU23 may be coupled to the respective conductive layers 30 included in the third stack group SG3 (see FIG. 8) of the second memory block BLK2. The pass transistors included in the second pass transistor unit PTU24 may be coupled to the respective conductive layers 30 included in the fourth stack group SG4 (see FIG. 8) of the second memory block BLK2.

The first pass transistor units PTU11 to PTU14 may be disposed adjacent to the page buffer units PBU1, PBU3, and PBU5 that are disposed under the first memory block BLK1, in the second direction SD with the contact regions CONT1 to CONT4 interposed therebetween. When the page buffer units PBU1, PBU3, and PBU5 disposed under the first memory block BLK1 are disposed in the odd-numbered cell regions CELL1, CELL3, and CELL5, the first pass transistor units PTU11 to PTU14 may be disposed in the even-numbered cell regions CELL2 and CELL4.

The second pass transistor units PTU21 to PTU24 may be disposed adjacent to the page buffer units PBU2 and PBU4 that are disposed under the second memory block BLK2, in the second direction SD with the contact regions CONT1 to CONT4 interposed therebetween. When the page buffer units PBU2 and PBU4 disposed under the second memory block BLK2 are disposed in the even-numbered cell regions CELL2 and CELL4, the second pass transistor units PTU21 to PTU24 may be disposed in the odd-numbered cell regions CELL1, CELL3, and CELL5.

By these structures, the first pass transistor units PTU11 to PTU14 disposed under the first memory block BLK1 and the second pass transistor units PTU21 to PTU24 disposed under the second memory block BLK2 may be disposed in the directions intersecting with the first direction FD and the second direction SD with respect to the contact regions CONT1 to CONT4. In other words, the first pass transistor units PTU11 to PTU14 and the second pass transistor units PTU21 to PTU24 may be arranged in a zigzag pattern.

Figure 9:
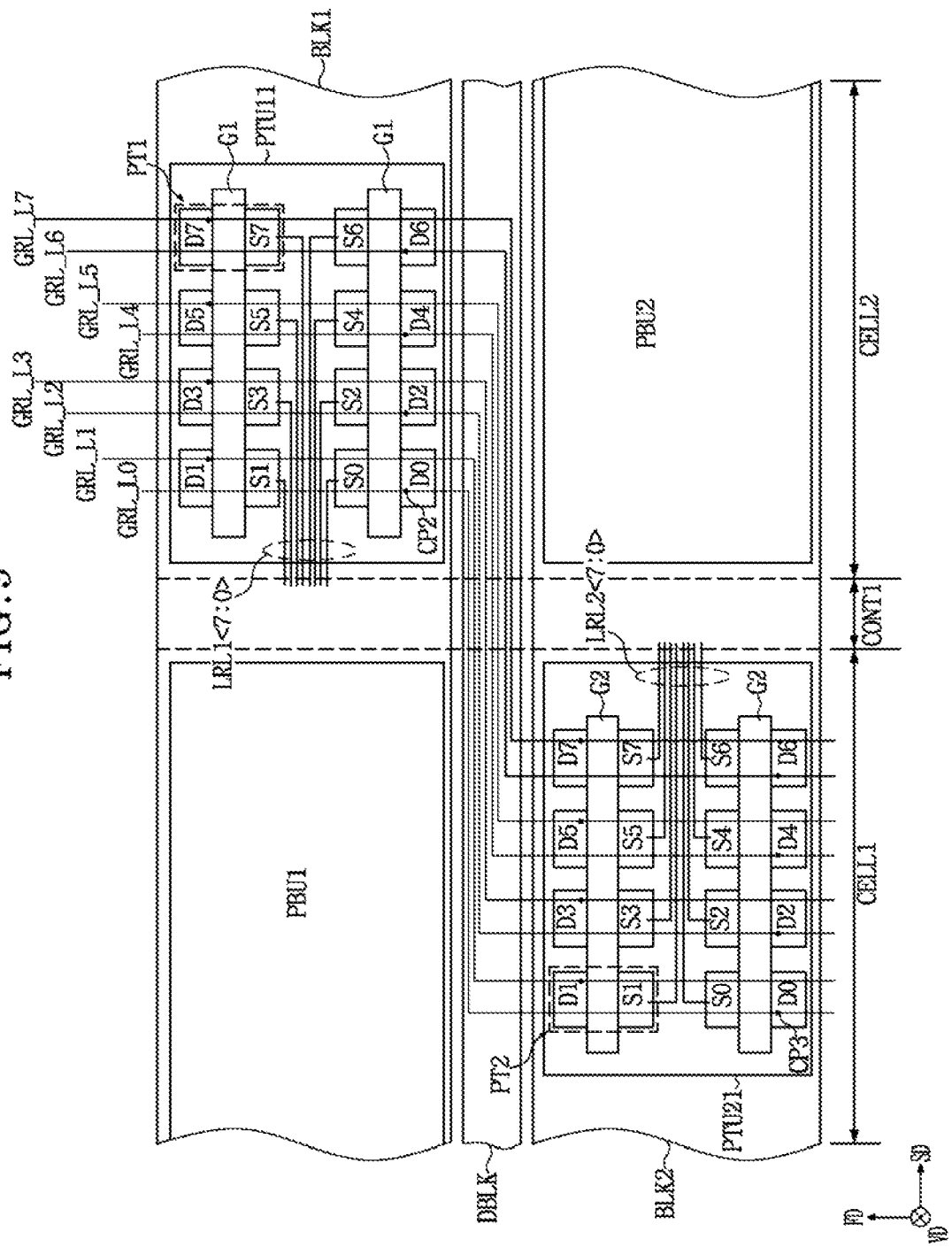
FIG. 9 is a top view illustrating first and second pass transistor units shown in FIG. 6.

FIG. 9 is a top view illustrating in detail the first pass transistor unit PTU11 and the second pass transistor unit PTU21 shown in FIG. 6.

Besides the first pass transistor unit PTU11 and the second pass transistor unit PTU21, the other first pass transistor units PTU12 to PTU14 (see FIG. 6) and the other second pass transistor units PTU22 to PTU24 (see FIG. 6) may be fabricated in a manner similar to the first pass transistor unit PTU11 and the second pass transistor unit PTU21.

Referring to FIG. 9, the first pass transistor unit PTU11 and the second pass transistor unit PTU21 are disposed in the direction intersecting with the first direction FD and the second direction SD with respect to the first contact region CONT1.

The first pass transistor unit PT11 may include a plurality of first pass transistors PT1. The second pass transistor unit PTU21 may include a plurality of second pass transistors PT2. The number of the first pass transistors PT1 included in the first pass transistor unit PTU11 and the number of the second pass transistors PT2 included in the second pass transistor unit PTU21 may be substantially the same. FIG. 9 illustrates a case where the first pass transistor unit PTU11 includes eight first pass transistors PT1 and the second pass transistor unit PTU21 includes eight second pass transistors PT2.

First gate lines G1 may be formed on the cell region CELL2 of the substrate 10 (see FIG. 5) under the first memory block BLK1. A gate dielectric layer (not shown) may be formed between the first gate lines G1 and the substrate 10. The first gate lines G1 may extend along the extending direction of the first memory block BLK1, that is, the second direction SD. The first pass transistors PT1 may be arranged along the extending direction of the first gate lines G1. The first gate lines G1 may be used as the gate electrodes of the first pass transistors PT1.

A plurality of active regions and a plurality of isolation regions may be alternately disposed along the second direction SD in the cell region CELL2 of the substrate 10 under the first memory block BLK1. Source regions S0 to S7 and drain regions D0 to D7, all of which are doped with an impurity, may be formed in the active regions on both sides of the first gate lines G1. Each of the first pass transistors PT1 may be configured by any one of first gate lines G1, any one source region (among the source regions S0 to S7) and any one drain region (among the drain regions D0 to D7) forming on both sides of any one of the first gate lines G1.

Second gate lines G2 may be formed on the cell region CELL1 of the substrate 10 (see FIG. 5) under the second memory block BLK2. A gate dielectric layer (not shown) may be formed between the second gate lines G2 and the substrate 10. The second gate lines G2 may extend along the extending direction of the second memory block BLK2, that is, the second direction SD. The second pass transistors PT2 may be arranged along the extending direction of the second gate lines G2. The second gate lines G2 may be used as the gate electrodes of the second pass transistors PT2.

A plurality of active regions and a plurality of isolation regions may be alternately disposed along the second direction SD in the cell region CELL1 of the substrate 10 under the second memory block BLK2. Source regions S0 to S7 and drain regions D0 to D7, all of which are doped with an impurity, may be formed in the active regions on both sides of the second gate lines G2. Each of the second pass transistors PT2 may be configured by any one of second gate lines G2, any one source region (among the source regions S0 to S7) and any one drain region (among the drain regions D0 to D7) forming on both sides of any one of the second gate lines G2.

The source regions S7 to S0 of the first pass transistors PT1 may be coupled to first local row lines LRL1<7:0>, respectively, and may be coupled to the conductive layers 30 included in the first stack group SG1 (see FIG. 8) of the first memory block BLK1, through the first local row lines LRL1<7:0>. The drain regions D0 to D7 of the first pass transistors PT1 may be coupled to bottom global row lines GRL_L0 to GRL_L7 through contact plugs CP2. The bottom global row lines GRL_L0 to GRL_L7 may be formed in the interlayer dielectric layer between the pass transistor units PTU11 to PTU24 (see FIG. 5) and the semiconductor layer 20 (see FIG. 5).

The source regions S7 to S0 of the second pass transistors PT2 may be coupled to second local row lines LRL2<7:0>, respectively, and may be coupled to the conductive layers 30 included in the first stack group SG1 (see FIG. 8) of the second memory block BLK2, through the second local row lines LRL2<7:0>. The drain regions D0 to D7 of the second pass transistors PT2 may be coupled to the bottom global row lines GRL_L0 to GRL_L7 through contact plugs CP3.

Each of the bottom global row lines GRL_L0 to GRL_L7 may be coupled in common to one of the first pass transistors PT1 and one of the second pass transistors PT2. Namely, one of the first pass transistors PT1 and one of the second pass transistors PT2 may share one of the bottom global row lines GRL_L0 to GRL_L7.

Because the first pass transistor unit PTU11 and the second pass transistor unit PTU21 are not disposed in a line along the first direction FD or the second direction SD but disposed in the direction intersecting with the first direction FD and the second direction SD, the first pass transistor PT1 and the second pass transistor PT2 that share one bottom global row line are also disposed in the direction intersecting with the first direction FD and the second direction SD. The bottom global row lines GRL_L0 to GRL_L7 are formed into shapes that are bent along the first pass transistors PT1 and the second pass transistors PT2 disposed in the direction intersecting with the first direction FD and the second direction SD. The structure of such bottom global row lines GRL_L0 to GRL_L7 will be described below in detail with reference to FIG. 10.

Referring again to FIGS. 5 and 6, bottom global row lines GRL_L<15:8> may be coupled in common to the first pass transistor unit PTU12 and the second pass transistor unit PTU22. While not shown, each of the bottom global row lines GRL_L<15:8> may be coupled in common to the drain of any one of the pass transistors included in the first pass transistor unit PTU12 and the drain of any one of the pass transistors included in the second pass transistor unit PTU22.

Bottom global row lines GRL_L<23:16> may be coupled in common to the first pass transistor unit PTU13 and the second pass transistor unit PTU23. While not shown each of the bottom global row lines GRL_L<23:16> may be coupled in common to the drain of any one of the pass transistors included in the first pass transistor unit PTU13 and the drain of any one of the pass transistors included in the second pass transistor unit PTU23.

Bottom global row lines GRL_L<31:24> may be coupled in common to the first pass transistor unit PTU14 and the second pass transistor unit PTU24. While not shown, each of the bottom global row lines GRL_L<31:24> may be coupled in common to the drain of any one of the pass transistors included in the first pass transistor unit PTU14 and the drain of any one of the pass transistors included in the second pass transistor unit PTU24.

A plurality of top global row lines GRL_T<1:0> corresponding to the respective bottom global row lines GRL_L<31:0> may be disposed over the dummy block DBLK.

The top global row lines GRL_T<31:0> may be coupled to the respective bottom global row lines GRL_L<31:0> through first contact plugs CP1. The first contact plugs CP1 may couple the top global row lines GRL_T<31:0> and the bottom global row lines GRL_L<31:0> through the dummy block DBLK and the semiconductor layer 20.

Figure 10:
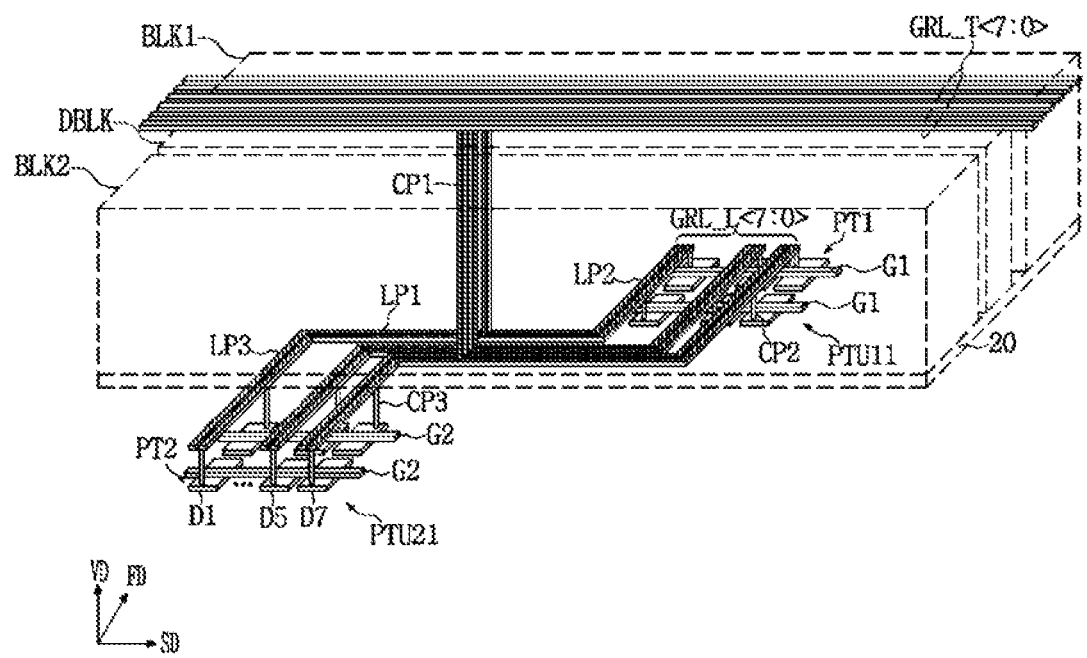
FIG. 10 is a perspective view to help explain a coupling relationship of bottom global row lines and top global row lines according to an embodiment of the present invention.

FIG. 10 is an illustration to assist in the detailed explanation of a coupling structure of bottom global row lines and top global row lines.

FIG. 10 illustrates only the bottom global row lines GRL_L<7:0> and the top global row lines GRL_T<7:0>, all of which are coupled to the first pass transistor unit PTU11 and the second pass transistor unit PTU21. The remaining bottom global row lines GRL_L<31:8> and the remaining top global row lines GRL_T<31:8> may be realized in a manner similar to the bottom global row lines GRL_L<7:0> and the top global row lines GRL_T<7:0>.

Referring to FIG. 10, the bottom global row lines GRL_L<7:0> may be formed in a bottom wiring layer between the first pass transistor unit PTU11 and the second pass transistor unit PTU21, and the semiconductor layer 20.

The plurality of top global row lines GRL_T<7:0> corresponding to the respective bottom global row lines GRL_L<7:0> may be formed over the dummy block DBLK. The top global row lines GRL_T<7:0> may extend in the second direction SD, and may be arranged along the first direction FD.

The top global row lines GRL_T<7:0> may be coupled to the corresponding bottom global row lines GRL_L<7:0>, respectively, through the first contact plugs CP1. The first contact plugs CP1 may couple the top global row lines GRL_T<7:0> and the bottom global row lines GRL_L<7:0> through the dummy block DBLK and the semiconductor layer 20.

A sidewall dielectric layer may be formed on the outer surfaces of the first contact plugs CP1. The sidewall dielectric layer may be formed to surround the outer wells of the first contact plugs CP1, and may insulate the first contact plugs CP1 and the dummy conductive layers 32 (see FIG. 7) of the dummy block DBLK from each other, and may also insulate the first contact plugs CP1 and the semiconductor layer 20 from each other.

Each of the bottom global row lines GRL_L<7:0> may include a first line pattern LP1 that is disposed under the dummy block DBLK and extends in the second direction SD, a second line pattern LP2 that extends from one end of the first line pattern LP1 to the first pass transistor unit PTU11 in the first direction FD, and a third line pattern LP3 that extends from the other end of the first line pattern LP1 to the second pass transistor unit PTU21 in the first direction FD.

The first line pattern LP1 may overlap with the dummy block DBLK in the vertical direction VD and be coupled to one of the top global row lines GRL_T through one of the first contact plugs CP1, which pass through the dummy block DBLK. The second line pattern LP2 may extend from the one end of the first line pattern LP1 to the first pass transistor unit PTU11 in the first direction FD, and may be coupled to the drain of any one of the first pass transistors PT1 included in the first pass transistor unit PTU11 through a second contact plug CP2. The third line pattern LP3 may extend from the other end of the first line pattern LP1 to the second pass transistor unit PTU21 in the first direction FD, and may be coupled to the drain of any one of the second pass transistors PT2 included in the second pass transistor unit PTU21 through a third contact plug CP3.

According to the present embodiment, the first contact plugs CP1, which couple the top global row lines GRL_T<7:0> and the bottom global row lines GRL_L<7:0>, may pass through the dummy block DBLK. Therefore, it is not necessary to cut the conductive layers 30 (see FIG. 7) of the first memory block BKL1 and the second memory block BLK2 to form spaces for disposition of the first contact plugs CP1.

When the conductive layers 30 (see FIG. 7) of the first memory block BLK1 and the second memory block BLK2 are cut and divided into a plurality of sections to form the spaces for disposition of the first contact plugs CP1, the number of pass transistors needed to apply an operating voltage to the conductive layers 30 increases in proportion to the number of the divided sections. For example, in the case where the number of the conductive layers 30 included in the first memory block BLK1 is 32 and the conductive layers 30 of the first memory block BLK1 are divided into three sections, the number of pass transistors needed to transfer the operating voltage to the first memory block BLK1 will be 32×3. This is a number corresponding to three times the number of pass transistors needed in the case where the conductive layers 30 of the first memory block BLK1 are not cut. If the number of needed pass transistors increases in this way, the size of the semiconductor memory device will increase as the occupation area of the pass transistors increases.

According to the present embodiment, the conductive layers 30 of the first memory block BLK1 and the second memory blocks BLK2 may traverse the contact regions CONT1 to CONT4 and the cell regions CELL1 to CELL5 without being cut along the second direction SD. Thus, the number of pass transistors needed to transfer the operating voltage to the respective first memory block BLK1 and the second memory block BLK2 will be the same as the number of the conductive layers 30 included in each of the first memory block BLK1 and the second memory blocks BLK2. Therefore, when compared to the case where the first memory block BLK1 and the second memory block BLK2 are cut, the number of pass transistors decreases, and the number of various wiring lines coupled to the pass transistors, for example, local row lines LRL and global row lines GRL_L and GRL_T may also be decreased. Thus, since areas occupied by the pass transistors and the wiring lines coupled to the pass transistors are reduced, the degree of integration of the semiconductor memory device may be improved.

Furthermore, because the dummy block DBLK is disposed between the first memory block BLK1 and the second memory block BLK2, it is possible to secure spaces in which the bottom global row lines GRL_L are routed in the extending direction of the first memory block BLK1 and the second memory block BLK2, that is, the second direction SD. Accordingly, even in the case where the pass transistors coupled to the different memory blocks are not disposed in a line along the first direction FD and are disposed in a direction different from the first direction FD, it is possible to share global row lines. Hence, as the number and occupation area of global row lines are reduced, the size of the semiconductor memory device may be reduced.

While the illustration described above with reference to FIGS. 5 to 10 includes two memory blocks, it is to be noted that three or more memory blocks may be disposed along the first direction FD.

Figure 11:
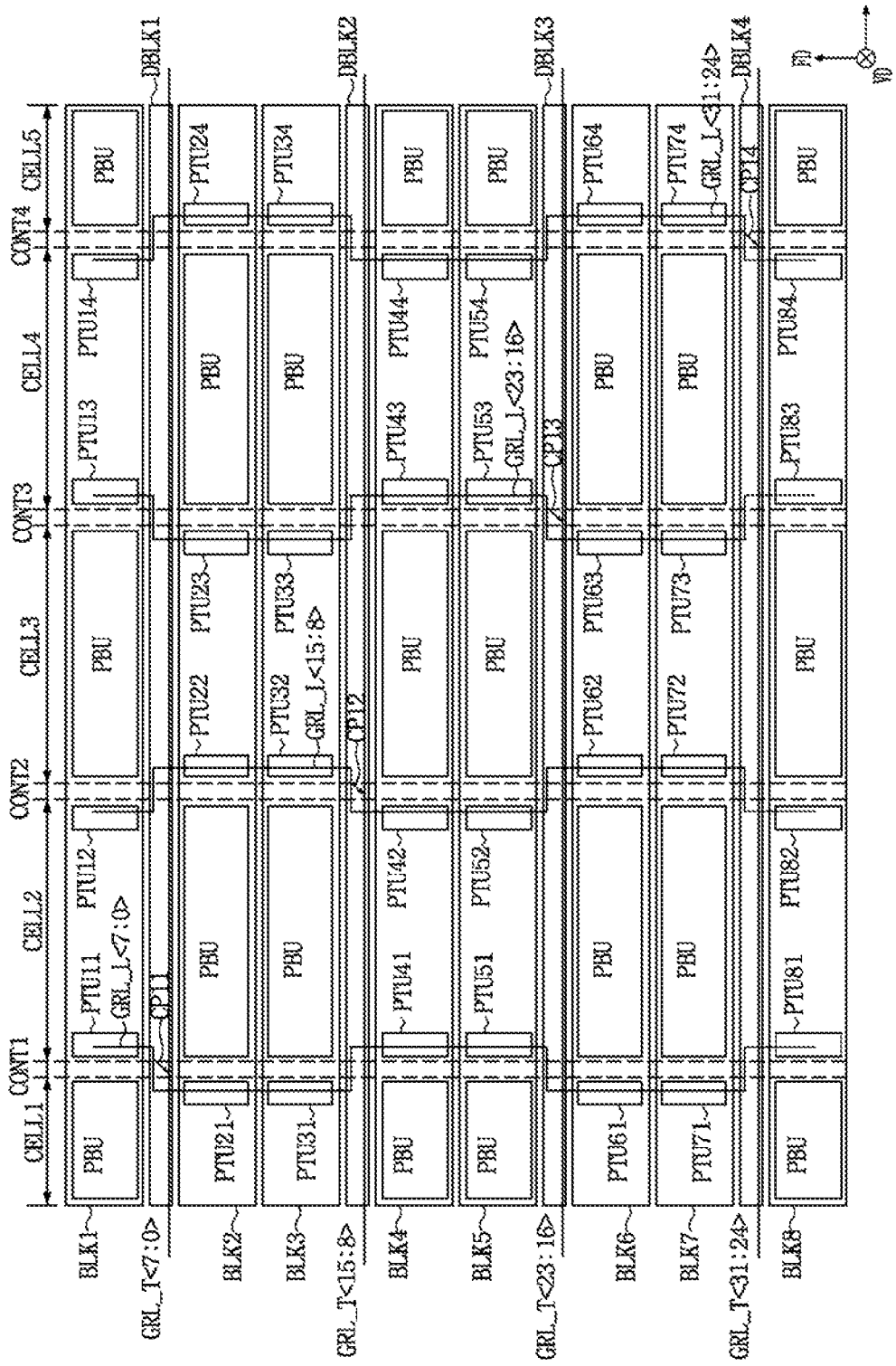
FIG. 11 is top view schematically illustrating a semiconductor memory device according to an embodiment of the present invention.

FIG. 11 is a top view schematically illustrating semiconductor memory device that includes eight memory blocks.

Referring to FIG. 11, eight memory blocks BLK1 to BLK8 may be disposed along the first direction FD. Dummy blocks DBLK1 to DBLK4 may be disposed between odd-numbered memory blocks BLK1, BLK3, BLK5, and BLK7 and even-numbered memory blocks BLK2, BLK4, BLK6, and BLK8.

Pass transistor units PTU11, PTU21, PTU31, PTU41, PTU51, PTU61, PTU71, and PTU81 corresponding to the respective memory blocks BLK1 to BLK8 may be disposed in the cell regions CELL1 and CELL2 on both sides of the first contact region CONT1. Each of the pass transistor units PTU11, PTU21, PTU31, PTU41, PTU51, PTU61, and PTU81 may include a plurality of pass transistors that are coupled to the respective conductive layers 30 (see FIG. 8) included in the first stack group SG1 (see FIG. 8) of a corresponding memory block. Each of the pass transistor units PTU11, PTU21, PTU31, PTU41, PTU51, PTU61, PTU71, and PTU81 may overlap with a corresponding memory block in the vertical direction VD.

The pass transistor units PTU11, PTU21, PTU31, PTU41, PTU51, PTU61, PTU71, and PTU81 may be disposed in a zigzag pattern with respect to the first contact region CONT1. The bottom global row lines GRL_L<7:0> may be formed into shapes that are bent along the pass transistor units PTU11, PTU21, PTU31, PTU41, PTU51, PTU61, PTU71, and PTU81 disposed in the zigzag pattern. The respective bottom global row lines GRL_L<7:0> may be coupled in common to the pass transistor units PTU11, PTU21, PTU31, PTU41, PTU51, PTU61, PTU71, and PTU81.

Pass transistor units PTU12, PTU22, PTU32, PTU42, PTU52, PTU62, PTU72, and PTU82 corresponding to the respective memory blocks BLK1 to BLK8 may be disposed in the cell regions CELL2 and CELL3 on both sides of the second contact region CONT2. Each of the pass transistor units PTU12, PTU22, PTU32, PTU42, PTU52, PTU62, PTU72, and PTU82 may include a plurality of pass transistors that are coupled to the respective conductive layers 30 (see FIG. 8) included in the second stack group SG2 (see FIG. 8) of a corresponding memory block. Each of the pass transistor units PTU12, PTU22, PTU32, PTU42, PTU52, PTU62, PTU72, and PTU82 may overlap with a corresponding memory block in the vertical direction VD.

The pass transistor units PTU12, PTU22, PTU32, PTU42, PTU52, PTU62, PTU72 and PTU82 may be disposed in a zigzag pattern with respect to the second contact region CONT2. The bottom global row lines GRL_L<15:8> may be formed into shapes that are bent along the pass transistor units PTU12, PTU22, PTU32, PTU42, PTU52, PTU62, PTU72, and PTU82 disposed in the zigzag pattern. The respective bottom global row lines GRL_L<15:8> may be coupled in common to the pass transistor units PTU12, PTU22, PTU32, PTU42, PTU52, PTU62, PTU72, and PTU82.

Pass transistor units PTU13, PTU23, PTU33, PTU43, PTU53, PTU63, PTU73, and PTU83 corresponding to the respective memory blocks BLK1 to BLK8 may be disposed in the cell regions CELL3 and CELL4 on both sides of the third contact region CONT3. Each of the pass transistor units PTU13, PTU23, PTU33, PTU43, PTU53, PTU63, PTU73, and PTU83 may include a plurality of pass transistors that are coupled to the respective conductive layers 30 (see FIG. 8) included in the third stack group SG3 (see FIG. 8) of a corresponding memory block. Each of the pass transistor units PTU13, PTU23, PTU33, PTU43, PTU53, PTU63, PTU73, and PTU83 may overlap with a corresponding memory block in the vertical direction VD.

The pass transistor units PTU13, PTU23, PTU33, PTU43, PTU53, PTU63, PTU73, and PTU83 may be disposed in a zigzag pattern with respect to the third contact region CONT3. The bottom global row lines GRL_L<23:16> may be formed into shapes that are bent along the pass transistor units PTU13, PTU23, PTU33, PTU43, PTU53, PTU63, PTU73, and PTU83 disposed in the zigzag pattern. The respective bottom global row lines GRL_L<23:16> may be coupled in common to the pass transistor units PTU13, PTU23, PTU33, PTU43, PTU53, PTU63, PTU73, and PTU83.

Pass transistor units PTU14, PTU24, PTU34, PTU44, PTU54, PTU64, PTU74, and PTU84 corresponding to the respective memory blocks BLK1 to BLK8 may be disposed in the cell regions CELL4 and CELL5 on both sides of the fourth contact region CONT4. Each of the pass transistor units PTU14, PTU24, PTU34, PTU44, PTU54, PTU64, PTU74, and PTU84 may include a plurality of pass transistors that are coupled to the respective conductive layers 30 (see FIG. 8) included in the fourth stack group SG4 (see FIG. 8) of a corresponding memory block. Each of the transistor units PTU14, PTU24, PTU34, PTU44, PTU54, PTU64, PTU74, and PTU84 may overlap with a corresponding memory block in the vertical direction VD.

The pass transistor units PTU14, PTU24, PTU34, PTU44, PTU54, PTU64, PTU74, and PTU84 may be disposed in a zigzag pattern with respect to the fourth contact region CONT4. The bottom global row lines GRL_L<31:24> may be formed into shapes that are bent along the pass transistor units PTU14, PTU24, PTU34, PTU44, PTU54, PTU64, PTU74, and PTU84 disposed in the zigzag pattern. The respective bottom global row lines GRL_L<31:24> may be coupled in common to the pass transistor units PTU14, PTU24, PTU34, PTU44, PTU54, PTU64, PTU74, and PTU84.

The top global row lines GRL_T<31:0> may be disposed over the dummy blocks DBLK1 to DBLK4. For example, the top global row lines GRL_T<7:0> may be disposed over the dummy block DBLK1 the top global row lines GRL_T<15:8> may be disposed over the dummy block DBLK2, the top global row lines GRL_T<23:16> may be disposed over the dummy block DBLK3, and the top global row lines GRL_T<31:24> may be disposed over the dummy block DBLK4.

The top global row lines GRL_T<7:0> may be coupled to the respective bottom global row lines GRL_L<7:0> through contact plugs CP11, which pass through the dummy block DBLK1. The top global row lines GRL_T<15:8> may be coupled to the respective bottom global row lines GRL_L<15:8> through contact plugs CP12, which pass through the dummy block DBLK2. The top global row lines GRL_T<23:16> may be coupled to the respective bottom global row lines GRL_L<23:16> through contact plugs CP13, which pass through the dummy block DBLK3. The top global row lines GRL_T<31:24> may be coupled to the respective bottom global row lines GRL_L<31:24> through contact plugs CP14, which pass through the dummy block DBLK4.

Figure 12:
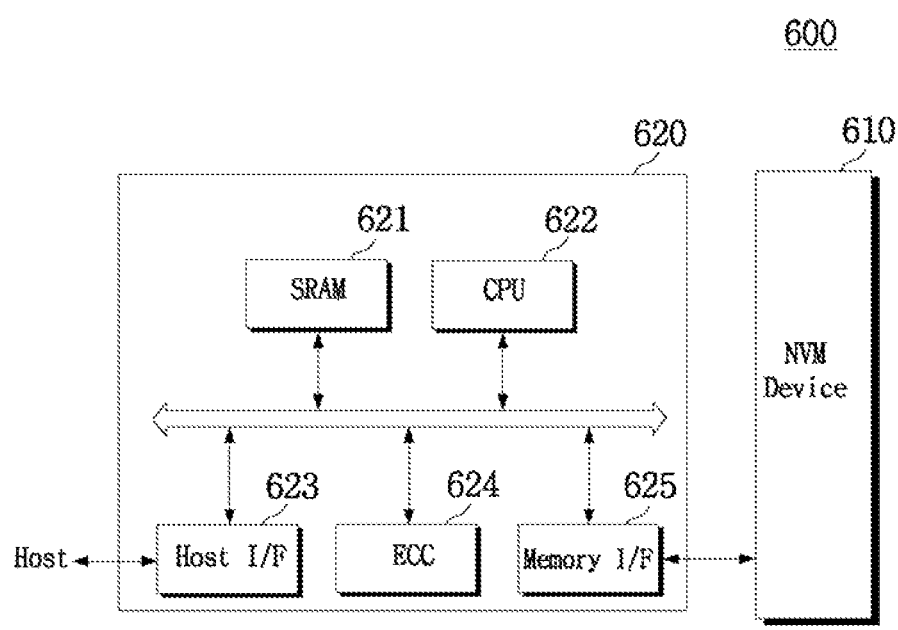
FIG. 12 is a diagram schematically illustrating a memory system including a semiconductor memory device.

FIG. 12 is a simplified block diagram schematically illustrating a memory system 600 including a semiconductor memory device 610 according to an embodiment of the present invention.

Referring to FIG. 12, the memory system 600 may include the semiconductor memory device 610 and a memory controller 620.

The semiconductor memory device 610 may be comprised of the semiconductor memory device according to an embodiment of the invention as described above, and may be operated in the manner described above. The memory controller 620 may control the semiconductor memory device 610. For example, the combination of the semiconductor memory device 610 and the memory controller 620 may be a memory card or a solid state disk (SSD). The memory controller 620 may include an SRAM 621, a central processing unit (CPU) 622, a host interface 623, an ECC block 624, and a memory interface 625.

The SRAM 621 may be used as a working memory of the CPU 622. The host interface 623 may include a data exchange protocol of a host that may be coupled with the memory system 600.

The ECC block 624 may detect and correct an error included in a data read out from the semiconductor memory device 610.

The memory interface 625 may interface with the semiconductor memory device 610. The CPU 622 may perform general control operations for data exchange of the memory controller 620.

Although not shown, it should be apparent to a person skilled in the art that the memory system 600 may further include a ROM, which stores code data for interfacing with the host. The semiconductor memory device 610 may be formed as a multi-chip package constructed by a plurality of flash memory chips.

The memory system 600 may be used as a high reliability storage medium having a low probability of an error occurring. The aforementioned nonvolatile memory device may be provided for a memory system such as a solid state disk (SSD). The memory controller 620 may communicate with an external device (for example, the host) through one of various interface protocols such as a universal serial bus (USB) protocol, a multimedia card (MMC) protocol, a peripheral component interconnection express (PCI-E) protocol, a serial advanced technology attachment (SATA) protocol, a parallel advanced technology attachment (PATA) protocol, a small computer system interface (SCSI) protocol, an enhanced small disk interface (ESDI) protocol, an integrated device electronics (IDE) protocol, and the like.

Figure 13:
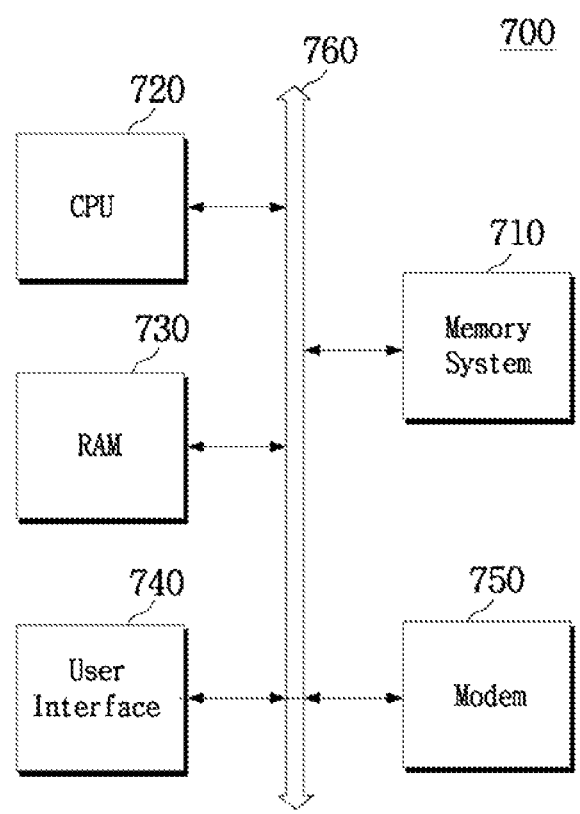
FIG. 13 is a block diagram schematically illustrating a computing system including a semiconductor memory device.

FIG. 13 is a simplified block diagram schematically illustrating a computing system 700 including a semiconductor memory device, according to an embodiment of the present invention.

Referring to FIG. 13, the computing system 700 according to an embodiment of the present invention may include a memory system 710, a microprocessor (or a CPU) 720, a RAM 730, a user interface 740, a modem 750 such as a baseband chipset, and a system bus 760. The memory system 710, the microprocessor (or a CPU) 720, the RAM 730, the user interface 740, and the modem 750 are electrically coupled to the system bus 760. In an embodiment, the computing system 700 may be a mobile device, in which case a battery (not shown) for supplying an operating voltage of the computing system 700 may be additionally provided. Although not shown in the drawing, it should be apparent to a person skilled in the art that the computing system 700 may further comprise an application chipset, a CMOS image sensor (CIS), a mobile DRAM, and so on. The memory system 710 may be, for example, a solid state drive/disk (SSD), which uses a nonvolatile memory to store data. Also as an example, the memory system 710 may be a fusion flash memory such as a NAND or a NOR flash memory.

It is noted that the above-described embodiments are realized not only by a device and a method, but may also be realized by a program that performs a function corresponding to the configuration of each embodiment or a recording medium on which the program is recorded. Such realization may be easily derived from the descriptions of the above-described embodiments by a person skilled in the art to which the embodiments pertain.

Although various embodiments have been described for illustrative purposes, it will be apparent to those skilled in the art that various changes and modifications may be made without departing from the spirit and scope of the invention as defined in the following claims.

What is claimed is:

1. A semiconductor memory device comprising:
   first and second memory blocks disposed adjacent to each other in a first direction, each of the first and second memory blocks including a plurality of conductive layers and a plurality of dielectric layers alternately stacked over a semiconductor layer disposed over a substrate, and a plurality of channel structures passing through the conductive layers and the dielectric layers;
   a dummy block disposed over the semiconductor layer, and provided between the first memory block and the second memory block;
   a plurality of first pass transistors formed over the substrate and below the first memory block, and coupled to the respective conductive layers of the first memory block;
   a plurality of second pass transistors formed over the substrate and below the second memory block, and coupled to the respective conductive layers of the second memory block;
   a plurality of bottom global row lines formed in a bottom wiring layer below the semiconductor layer, and each of the bottom global row lines being coupled in common to one of the first pass transistors and one of the second pass transistors; and
   top global row lines formed over the dummy block, and each of the top global row lines being coupled to a respective one of the bottom global row lines through a respective one of first contact plugs passing through the dummy block.

2. The semiconductor memory device according to claim 1,
   wherein the first and second memory blocks and the dummy block extend in a second direction, and
   wherein one of the first pass transistors and one of the second pass transistors are disposed in a direction intersecting with the first direction and the second direction.

3. The semiconductor memory device according to claim 2, wherein each of the bottom global row lines comprises:
   a first line pattern overlapping with the dummy block, extending in the second direction and coupled to one of the first contact plugs;
   a second line pattern extending from one end of the first line pattern toward the first pass transistor in the first direction, and coupled to the first pass transistor through a second contact plug; and
   a third line pattern extending from the other end of the first line pattern toward the second pass transistor in the first direction, and coupled to the second pass transistor through a third contact plug.

4. The semiconductor memory device according to claim 1,
   wherein each of the first and second memory blocks comprises:
   N (N is a natural number equal to or greater than 2) number of stack groups stacked over the semiconductor layer, and each of the stack groups including a predetermined number of the conductive layers; and
   N number stepped grooves corresponding to the respective stack groups and each exposing the predetermined number of the conductive layers of a corresponding stack group in a step-like shape, and
   wherein the stepped grooves are disposed in a line along a second direction parallel to an extending direction of the first and second memory blocks and the dummy block.

5. The semiconductor memory device according to claim 4, wherein a width of the stepped grooves in the first direction is smaller than a maximum width, in the first direction, of the conductive layers included in the first and second memory blocks.

6. The semiconductor memory device according to claim 4, wherein the substrate comprises:
   N number of contact regions corresponding to the stepped grooves; and
   a plurality of cell regions disposed along the second direction with the contact regions interposed therebetween.

7. The semiconductor memory device according to claim 6, further comprising:
a plurality of page buffers formed over the substrate below the first and second memory blocks, and coupled to the first and second memory blocks through bit lines, and
wherein the page buffers are disposed in odd-numbered cell regions below the first memory block and even-numbered cell regions below the second memory block.

8. The semiconductor memory device according to claim 7, wherein the plurality of first pass transistors are disposed in the even-numbered cell regions below the first memory block, and the plurality of second pass transistors are disposed in the odd-numbered cell regions below the second memory block.

9. The semiconductor memory device according to claim 6, wherein the conductive layers of the first and second memory blocks are configured to traverse the contact regions and the cell regions without being cut along the second direction.

10. The semiconductor memory device according to claim 1, further comprising:
slits separating the first memory block and the dummy block from each other and separating the second memory block and the dummy block from each other.

11. The semiconductor memory device according to claim 1, wherein the dummy block has a structure in which a plurality of dummy conductive layers and a plurality of dielectric layers are alternately stacked.

12. The semiconductor memory device according to claim 11, wherein the dummy conductive layers are disposed at the same layers as the conductive layers of the first and second memory blocks.

13. The semiconductor memory device according to claim 12, wherein one of the conductive layers and one of the dummy conductive layers, both of which are disposed at the same layer among the conductive layers and the dummy conductive layers, are formed of the same material.

14. The semiconductor memory device according to claim 11, further comprising:
a sidewall dielectric layer surrounding outer walls of the first contact plugs, and isolating the first contact plugs and the dummy conductive layers from each other.

15. A semiconductor memory device comprising:
a substrate including a plurality of cell regions arranged along a second direction different from a first direction, and contact regions disposed between the cell regions;
first and second memory blocks disposed adjacent to each other in the first direction, each including a plurality of conductive layers and a plurality of dielectric layers alternately stacked over a semiconductor layer formed over the substrate, and a plurality of channel structures passing through the conductive layers and the dielectric layers in the cell regions;
a dummy block disposed over the semiconductor layer between the first memory block and the second memory block;
first pass transistor units each including a predetermined number of first pass transistors coupled to conductive layers of the first memory block, and formed over even-numbered cell regions of the substrate to overlap with the first memory block;
second pass transistor units each including a predetermined number of second pass transistors coupled to conductive layers of the second memory block, and formed over odd-numbered cell regions of the substrate to overlap with the second memory block;
a plurality of bottom global row lines formed in a bottom wiring layer below the semiconductor layer, and each of the bottom global row lines being coupled in common to one of the first pass transistors and one of the second pass transistors; and
a plurality of top global row lines formed over the dummy block, and each of the top global row lines being coupled to a respective one of the bottom global row lines through a respective one of first contact plugs passing through the dummy block and the semiconductor layer.

16. The semiconductor memory device according to claim 15, wherein each of the bottom global row lines comprises:
a first line pattern overlapping with the dummy block, extending in the second direction and coupled to any one of the first contact plugs;
a second line pattern extending from one end of the first line pattern in the first direction, and coupled to one of the first pass transistors through a second contact plug; and
a third line pattern extending from the other end of the first line pattern in the first direction, and coupled to one of the second pass transistors through a third contact plug.

17. The semiconductor memory device according to claim 15, wherein the first pass transistor units or the second pass transistor units correspond to the respective contact regions and are disposed adjacent to corresponding contact regions, respectively, in the second direction.

18. The semiconductor memory device according to claim 13, further comprising:
a sidewall dielectric layer formed over outer surfaces of the first contact plugs, and isolating the first contact plugs and the dummy block from each other and the first contact plugs and the semiconductor layer from each other.

19. The semiconductor memory device according to claim 15, wherein conductive layers of the first and second memory blocks are configured to traverse the contact regions and the cell regions without being cut along the second direction.

* * * * *